(12) United States Patent
Mao et al.

(10) Patent No.: US 6,490,140 B1
(45) Date of Patent: *Dec. 3, 2002

(54) GIANT MAGNETORESISTIVE SENSOR WITH A PTMNX PINNING LAYER AND A NIFECR SEED LAYER

(75) Inventors: Sining Mao, Savage, MN (US); Zheng Gao, Bloomington, MN (US); Eric W. Singleton, Greenfield, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/528,346

(22) Filed: Mar. 17, 2000

Related U.S. Application Data (63) Continuation-in-part of application No. 09/380,435, filed on Sep. 1, 1999.
(60) Provisional application No. 60/131,567, filed on Apr. 29, 1999.

(51) Int. Cl.$^7$ .................................................. G11B 5/39
(52) U.S. Cl. .............................. 360/324.11; 360/324.11
(58) Field of Search .......................... 360/324.1, 324.11, 360/324.12, 317

(56) References Cited

U.S. PATENT DOCUMENTS

| | | | | |
|---|---|---|---|---|
| 5,852,533 A | * | 12/1998 | Miyauchi et al. | 360/113 |
| 5,959,810 A | * | 9/1999 | Kakihara et al. | 360/324.12 |
| 6,115,224 A | * | 9/2000 | Saito | 360/324.1 |
| 6,122,151 A | * | 9/2000 | Saito et al. | 360/324.12 |

* cited by examiner

*Primary Examiner*—Jefferson Evans
(74) *Attorney, Agent, or Firm*—Kinney & Lange, P.A.

(57) ABSTRACT

A giant magnetoresistive stack for use in a magnetic read head includes a NiFeCr seed layer, a ferromagnetic free layer, at least one nonmagnetic spacer layer, at least one ferromagnetic pinned layer, and at least one PtMnX pinning layer, where X is selected from the group consisting of Cr, Pd, Nb, Re, Rh, Ta, Ru, Os, Zr, Hf, Ni, Co, and Fe. The ferromagnetic free layer has a rotatable magnetic moment. The ferromagnetic pinned layer has a fixed magnetic moment and is positioned adjacent to the PtMnX pinning layer. The nonmagnetic spacer layer is positioned between the free layer and the pinned layer. The NiFeCr seed layer is positioned adjacent to either the free layer or the pinning layer.

21 Claims, 8 Drawing Sheets

GIANT MAGNETORESISTIVE SENSOR WITH A PTMNX PINNING LAYER AND A NIFECR SEED LAYER

CROSS-REFERENCE TO RELATED APPLICATIONS

This application is a continuation-in-part of application Ser. No. 09/380,435, filed Sep. 1, 1999, entitled "Giant Magnetoresistive Sensor with a PTMN (Cr or Pd) Pinning Layer and a NiFeCr Seed Layer, which claims priority from Provisional Application No. 60/131,567, filed Apr. 28, 1999.

BACKGROUND OF THE INVENTION

The present invention relates generally to a giant magnetoresistive sensor for use in a magnetic read head. In particular, the present invention relates to a giant magnetoresistive read sensor having improved thermal and magnetic stability.

Giant magnetoresistive (GMR) read sensors are used in magnetic data storage systems to detect magnetically-encoded information stored on a magnetic data storage medium such as a magnetic disc. A time-dependent magnetic field from a magnetic medium directly modulates the resistivity of the GMR read sensor. A change in resistance of the GMR read sensor can be detected by passing a sense current through the GMR read sensor and measuring the voltage across the GMR read sensor. The resulting signal can be used to recover the encoded information from the magnetic medium.

A typical GMR read sensor configuration is the GMR spin valve, in which the GMR read sensor is a multi-layered structure formed of a nonmagnetic spacer layer positioned between a ferromagnetic pinned layer and a ferromagnetic free layer. The magnetization of the pinned layer is fixed in a predetermined direction, typically normal to an air bearing surface of the GMR read sensor, while the magnetization of the free layer rotates freely in response to an external magnetic field. The resistance of the GMR read sensor varies as a function of an angle formed between the magnetization direction of the free layer and the magnetization direction of the pinned layer. This multi-layered spin valve configuration allows for a more pronounced magnetoresistive effect, i.e. greater sensitivity and higher total change in resistance, than is possible with anisotropic magnetoresistive (AMR) read sensors, which generally consist of a single ferromagnetic layer.

A pinning layer is typically exchange coupled to the pinned layer to fix the magnetization of the pinned layer in a predetermined direction. The pinning layer is typically formed of an antiferromagnetic material. In antiferromagnetic materials, the magnetic moments of adjacent atoms point in opposite directions and, thus, there is no net magnetic moment in the material.

A seed layer is typically used to promote the texture and enhance the grain growth of the free layer or pinning layer consequently grown on top of it. The seed layer material is chosen such that its atomic structure, or arrangement, corresponds with the preferred crystallographic direction of the magnetization of the free layer or pinning layer material.

Principal concerns in the performance of GMR read sensors are the thermal and magnetic stability of the GMR read sensor. When the pinning layer is exchange coupled to the pinned layer during manufacturing, the GMR read sensor must not experience diffusion between thin layers in the GMR read sensor. After the pinning layer is exchange coupled to the pinned layer to fix the magnetization of the pinned layer in a predetermined direction, a sufficient exchange coupling field, or pinning field, is required to keep the magnetization of the pinned layer unchanged during the operation of the GMR read sensor.

Key determinants of the thermal and magnetic stability of the GMR read sensor are the materials used as the pinning layer and as the seed layer in the GMR read sensor. The annealing temperature of the pinning layer material is the temperature at which the pinning and pinned layers are exchange coupled during manufacturing. It is desirable for the pinning layer material to have a low annealing temperature to control magnetic behavior and prevent diffusion between thin layers in the GMR spin valve. The blocking temperature of the pinning layer material is the temperature at which the exchange coupling disappears. It is desirable for the pinning layer material to have a high blocking temperature to prevent the magnetization of the pinned layer from changing during the operation of the GMR read sensor. Also, the seed layer material affects the strength of the exchange coupling field, or pinning strength. It is desirable for the seed layer material/pinning layer material combination to have a high pinning strength to keep the magnetization of the pinned layer unchanged.

Accordingly, there is a need for a pinning layer material with a high blocking temperature and a low annealing temperature, and for a seed layer material that, when used with the pinning layer material, produces a high pinning strength.

BRIEF SUMMARY OF THE INVENTION

The present invention is a giant magnetoresistive stack for use in a magnetic read head. The giant magnetoresistive stack includes a NiFeCr seed layer, a ferromagnetic free layer, at least one nonmagnetic spacer layer, at least one ferromagnetic pinned layer, and at least one PtMnX pinning layer, where X is selected from the group consisting of Cr, Pd, Nb, Re, Rh, Ta, Ru, Os, Zr, Hf, Ni, Co, and Fe. The free layer has a rotatable magnetic moment. The pinned layer has a fixed magnetic moment and is positioned adjacent to the PtMnX pinning layer. The spacer layer is positioned between the free layer and the pinned layer. The NiFeCr seed layer is positioned adjacent to either the free layer or the pinning layer.

In a first preferred embodiment, the seed layer is adjacent to the free layer, the free layer is a NiFe/CoFe bilayer, the spacer layer is formed of copper, the pinned layer is formed of CoFe, and the pinning layer is formed of PtMnX.

In a second preferred embodiment, the seed layer is adjacent to the free layer, the free layer is a NiFe/CoFe bilayer, the spacer layer is formed of copper, the pinned layer is a CoFe/Ru/CoFe synthetic antiferromagnet, and the pinning layer is formed of PtMnX.

In a third preferred embodiment, the seed layer is a NiFeCr/NiFe bilayer and is adjacent to the pinning layer, the pinning layer is formed of PtMnX, the pinned layer is formed of CoFe, the spacer layer is formed of copper, and the free layer is a CoFe/NiFe bilayer.

In a fourth preferred embodiment, the seed layer is a NiFeCr/NiFe bilayer and is adjacent to the first pinning layer, the first pinning layer is formed of PtMnX, the first pinned layer is a CoFe/Ru/CoFe synthetic antiferromagnet, the first spacer layer is formed of copper, the free layer is formed of CoFe, the second spacer layer is formed of copper, the second pinned layer is a CoFe/Ru/CoFe synthetic antiferromagnet, and the second pinning layer is formed of PtMnX.

In a fifth preferred embodiment, the seed layer is a NiFeCr/NiFe bilayer and is adjacent to the first pinning layer, the first pinning layer is formed of PtMnX, the first pinned layer is a CoFe/Ru/CoFe synthetic antiferromagnet, the first spacer layer is formed of copper, the free layer is a CoFe/NiFe/CoFe trilayer, the second spacer layer is formed of copper, the second pinned layer is a CoFe/Ru/CoFe synthetic antiferromagnet, and the second pinning layer is formed of PtMnX.

DETAILED DESCRIPTION OF THE PREFERRED EMBODIMENTS

The present invention is a giant magnetoresistive (GMR) spin valve utilizing a novel combination of both a NiFeCr seed layer and a PtMnX pinning layer, where X is selected from the group consisting of Cr, Pd, Nb, Re, Rh, Ta, Ru, Os, Zr, Hf, Ni, Co, and Fe, to allow for an increased GMR response and improved thermal and magnetic stability.

This novel combination of seed layer material and pinning layer material has been shown to improve the GMR response of several configurations of GMR spin valves, including top spin valves, bottom spin valves, and dual spin valves. A top spin valve is a spin valve in which the free layer is deposited prior to the deposition of the pinned layer. Conversely, a bottom spin valve is a spin valve in which the pinned layer is deposited prior to the deposition of the free layer. Finally, a dual spin valve is a spin valve having two pinned layers separated by a single free layer.

In each of the top spin valve, bottom spin valve, and dual spin valve configurations, each of the pinned and free layers may be formed of a single layer of ferromagnetic material, or of several layers. Generally, multiple layer pinned and free layers will yield a higher GMR response.

The following discussion illustrates two embodiments of a top spin valve, one embodiment of a bottom spin valve, and two embodiments of a dual spin valve. The examples shown are merely meant to be illustrative, and the present invention is not intended to be limited to the specific embodiments shown.

Figure 1:
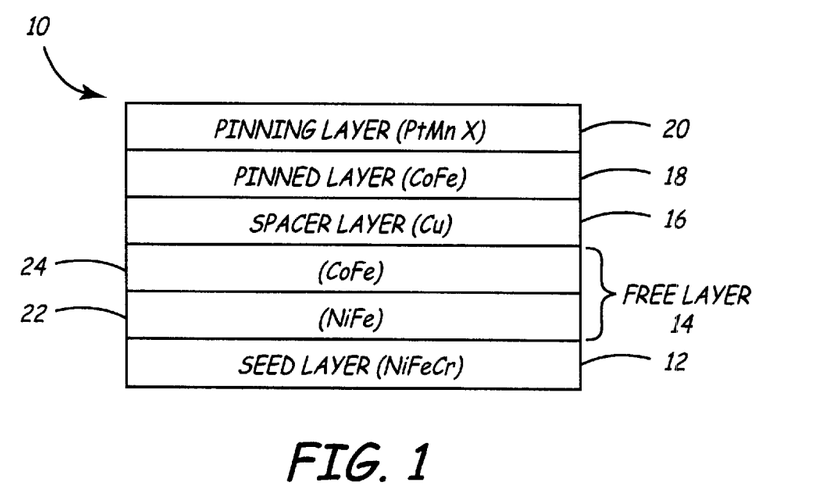
FIG. 1 is a layer diagram of a first embodiment of a giant magnetoresistive stack of the present invention.

FIG. 1 is a layer diagram of a first embodiment of a GMR stack 10 of the present invention, where GMR stack 10 is configured as a top spin valve. GMR stack 10 includes a seed layer 12, a free layer 14, a spacer layer 16, a pinned layer 18, and a pinning layer 20.

Seed layer 12 is NiFeCr. Free layer 14 includes a first ferromagnetic layer 22, preferably NiFe, and a second ferromagnetic layer 24, preferably CoFe, and is positioned such that first ferromagnetic layer 22 is adjacent to seed layer 12. Pinned layer 18 is a ferromagnetic material, preferably CoFe, and is positioned adjacent to pinning layer 20. Pinning layer 20 is PtMnX, where X is selected from the group consisting of Cr, Pd, Nb, Re, Rh, Ta, Ru, Os, Zr, Hf, Ni, Co, and Fe. Spacer layer 16 is a nonmagnetic material, preferably copper, and is positioned between free layer 14 and pinned layer 18.

The magnetization of pinned layer 18 is fixed in a predetermined direction while the magnetization of free layer 14 rotates freely in response to an external magnetic field emanating from a magnetic medium. The magnetization of pinned layer 18 is pinned by exchange coupling pinning layer 20 with pinned layer 18. Pinning layer 20 preferably has a blocking temperature of about 380° C. and an annealing temperature of about 270° C. The atomic structure of seed layer 12 is preferably face-centered cubic (fcc) to promote the [111] crystallographic texture and enhance the grain growth of free layer 14. The resistance of GMR stack 10 varies as a function of an angle that is formed between the magnetization of free layer 14 and the magnetization of pinned layer 18.

The composition of seed layer 12 is preferably in the range of about Ni(60)Fe(15)Cr(25) to about Ni(48)Fe(12)Cr(40), and more preferably approximately Ni(48)Fe(12)Cr(40), where the numbers in parentheses represent atomic percentage. The thickness of seed layer 12 is preferably in the range of about 20 Å to about 60 Å, and more preferably in the range of about 45 Å to about 50 Å.

The composition of first ferromagnetic layer 22 of free layer 14 is preferably in the range of about Ni(85)Fe(15) to about Ni(80.5)Fe(19.5), and more preferably approximately Ni(82)Fe(18). The thickness of first ferromagnetic layer 22 of free layer 14 is preferably in the range of about 20 Å to about 100 Å, and more preferably approximately 30 Å. The composition of second ferromagnetic layer 24 of free layer 14 is preferably approximately Co(90)Fe(10). The thickness of second ferromagnetic layer 24 of free layer 14 is preferably in the range of about 5 Å to about 25 Å, and more preferably approximately 13 Å.

The thickness of spacer layer 16 is preferably in the range of about 20 Å to about 35 Å, and more preferably approximately 24 Å.

The composition of pinned layer 18 is preferably approximately Co(90)Fe(10). The thickness of pinned layer 18 is preferably in the range of about 18 Å to about 30 Å, and more preferably approximately 25 Å.

The composition of pinning layer 20 when PtMnCr is used is preferably in the range of about Pt(36)Mn(64)Cr(>0) to about Pt(48)Mn(51)Cr(1), and more preferably approximately Pt(44)Mn(55.5)Cr(0.5). The thickness of pinning layer 20 in this case is preferably in the range of about 100 Å to about 300 Å, and more preferably approximately 200 Å. The composition of pinning layer 20 when PtMnPd is used is preferably in the range of about Pt(15)Mn(50)Pd(35) to about Pt(25)Mn(50)Pd(25), and more preferably approximately Pt(20)Mn(50)Pd(30). The thickness of pinning layer 20 in this case is preferably in the range of about 150 Å to about 300 Å, and more preferably approximately 250 Å.

Figure 2:
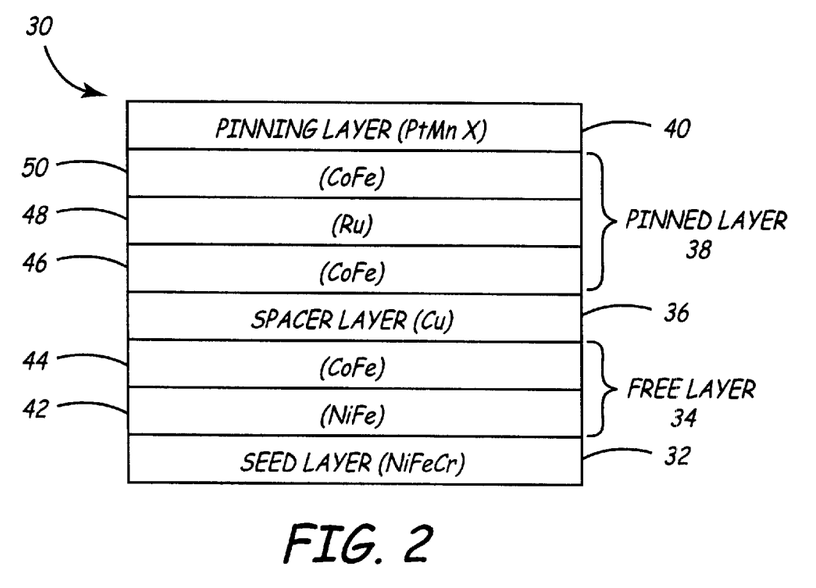
FIG. 2 is a layer diagram of a second embodiment of a giant magnetoresistive stack of the present invention.

FIG. 2 is a layer diagram of a second embodiment of a GMR stack 30 of the present invention, where GMR stack 30 is configured as a top spin valve. GMR stack 30 includes a seed layer 32, a free layer 34, a spacer layer 36, a pinned layer 38, and a pinning layer 40. GMR stack 30 is similar to GMR stack 10 of FIG. 1, except that pinned layer 38 of GMR stack 30 is a synthetic antiferromagnet, while pinned layer 18 of GMR stack 10 is a single ferromagnetic layer.

Seed layer 32 is NiFeCr. Free layer 34 includes a first ferromagnetic layer 42, preferably NiFe, and a second ferromagnetic layer 44, preferably CoFe, and is positioned such that first ferromagnetic layer 42 is adjacent to seed layer 32. Pinned layer 38 is a synthetic antiferromagnet and includes first and second ferromagnetic layers 46 and 50, both preferably CoFe, and a coupling layer 48, preferably ruthenium, positioned between first and second ferromagnetic layers 46 and 50, and is positioned such that second ferromagnetic layer 50 is adjacent to pinning layer 40. Pinning layer 40 is PtMnX, where X is selected from the group consisting of Cr, Pd, Nb, Re, Rh, Ta, Ru, Os, Zr, Hf, Ni, Co, and Fe. Spacer layer 36 is a nonmagnetic material, preferably copper, and is positioned between free layer 34 and pinned layer 38.

The magnetization of pinned layer 38 is fixed in a predetermined direction while the magnetization of free layer 34 rotates freely in response to an external magnetic field emanating from a magnetic medium. The magnetization of pinned layer 38 is pinned by exchange coupling pinning layer 40 with pinned layer 38. Pinning layer 40 preferably has a blocking temperature of about 380° C. and an annealing temperature of about 270° C. The atomic structure of seed layer 32 is preferably face-centered cubic (fcc) to promote the [111] crystallographic texture and enhance the grain growth of free layer 34. The resistance of GMR stack 30 varies as a function of an angle that is formed between the magnetization of free layer 34 and the magnetization of pinned layer 38.

The composition of seed layer 32 is preferably in the range of about Ni(60)Fe(15)Cr(25) to about Ni(48)Fe(12)Cr(40), and more preferably approximately Ni(48)Fe(12)Cr(40). The thickness of seed layer 32 is preferably in the range of about 20 Å to about 60 Å, and more preferably in the range of about 45 Å to about 50 Å.

The composition of first ferromagnetic layer 42 of free layer 34 is preferably in the range of about Ni(85)Fe(15) to about Ni(80.5)Fe(19.5), and more preferably approximately Ni(82)Fe(18). The thickness of first ferromagnetic layer 42 of free layer 34 is preferably in the range of about 20 Å to about 100 Å, and more preferably approximately 30 Å. The composition of second ferromagnetic layer 44 of free layer 34 is preferably approximately Co(90)Fe(10). The thickness of second ferromagnetic layer 44 of free layer 34 is preferably in the range of about 5 Å to about 25 Å, and more preferably approximately 13 Å.

The thickness of spacer layer 36 is preferably in the range of about 20 Å to about 35 Å, and more preferably approximately 24 Å.

The compositions of first and second ferromagnetic layers 46 and 50 of pinned layer 38 are both preferably approximately Co(90)Fe(10). The thicknesses of first and second ferromagnetic layers 46 and 50 of pinned layer 38 are both preferably in the range of about 15 Å to about 40 Å, and more preferably in the range of about 20 Å to about 30 Å. The thickness of coupling layer 48 of pinned layer 38 is preferably in the range of about 8 Å to about 12 Å.

The composition of pinning layer 40 when PtMnCr is used is preferably in the range of about Pt(36)Mn(64)Cr(>0) to about Pt(48)Mn(51)Cr(1), and more preferably approximately Pt(44)Mn(55.5)Cr(0.5). The thickness of pinning layer 40 in this case is preferably in the range of about 100 Å to about 300 Å, and more preferably approximately 200 Å. The composition of pinning layer 40 when PtMnPd is used is preferably in the range of about Pt(15)Mn(50)Pd(35) to about Pt(25)Mn(50)Pd(25), and more preferably approximately Pt(20)Mn(50)Pd(30). The thickness of pinning layer 40 in this case is preferably in the range of about 150 Å to about 300 Å, and more preferably approximately 250 Å.

Figure 3:
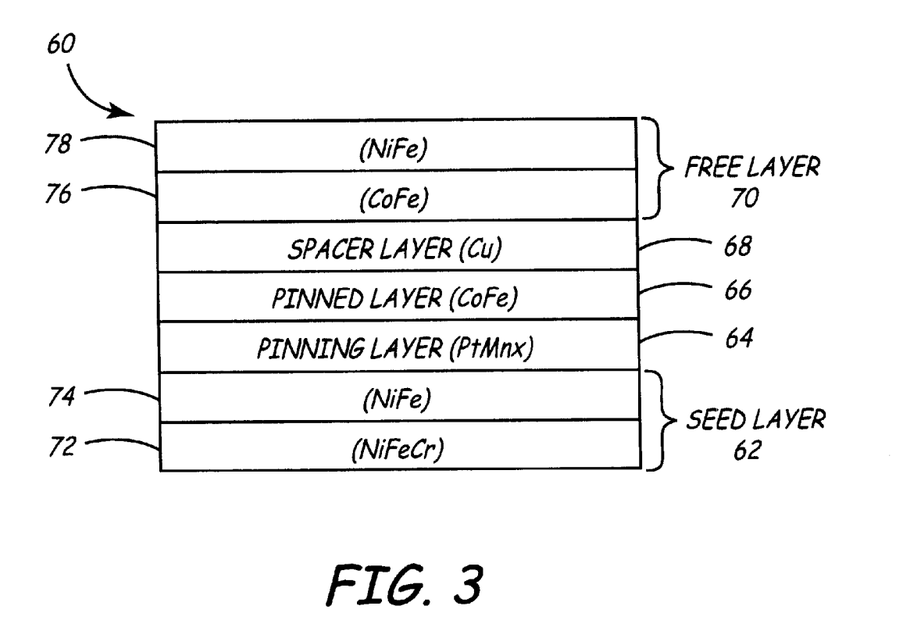
FIG. 3 is a layer diagram of a third embodiment of a giant magnetoresistive stack of the present invention.

FIG. 3 is a layer diagram of a third embodiment of a GMR stack 60 of the present invention, where GMR stack 60 is configured as a bottom spin valve. GMR stack 60 includes a seed layer 62, a pinning layer 64, a pinned layer 66, a spacer layer 68, and a free layer 70.

Seed layer 62 includes a NiFeCr layer 72 and a NiFe layer 74. Pinning layer 64 is PtMnX, where X is selected from the group consisting of Cr, Pd, Nb, Re, Rh, Ta, Ru, Os, Zr, Hf, Ni, Co, and Fe, and is positioned adjacent to NiFe layer 74 of seed layer 62. Pinned layer 66 is a ferromagnetic material, preferably CoFe, and is positioned adjacent to pinning layer 64. Free layer 70 includes a first ferromagnetic layer 76, preferably CoFe, and a second ferromagnetic layer 78, preferably NiFe. Spacer layer 68 is a nonmagnetic material, preferably copper, and is positioned between free layer 70 and pinned layer 66.

The magnetization of pinned layer 66 is fixed in a predetermined direction while the magnetization of free layer 70 rotates freely in response to an external magnetic field emanating from a magnetic medium. The magnetization of pinned layer 66 is pinned by exchange coupling pinning layer 64 with pinned layer 66. Pinning layer 64 has a blocking temperature of about 380° C. and an annealing temperature of about 270° C. The atomic structure of seed layer 62 is face-centered cubic (fcc) to promote the [111] crystallographic texture and enhance the grain growth of pinning layer 64. The resistance of GMR stack 60 varies as a function of an angle that is formed between the magnetization of free layer 70 and the magnetization of pinned layer 66.

The composition of NiFeCr layer 72 of seed layer 62 is preferably in the range of about Ni(60)Fe(15)Cr(25) to about Ni(48)Fe(12)Cr(40), and more preferably approximately Ni(48)Fe(12)Cr(40), where the numbers in parentheses represent atomic percentage. The thickness of NiFeCr layer 72 of seed layer 62 is preferably in the range of about 20 Å to about 60 Å, and more preferably in the range of about 45 Å to about 50 Å. The composition of NiFe layer 74 of seed layer 62 is preferably in the range of about Ni(85)Fe(15) to about Ni(80.5)Fe(19.5), and more preferably approximately Ni(82)Fe(18). The thickness of NiFe layer 74 of seed layer 62 is preferably in the range of about 5 Å to about 30 Å, and more preferably approximately 10 Å.

The composition of pinning layer 64 when PtMnCr is used is preferably in the range of about Pt(36)Mn(64)Cr(>0) to about Pt(48)Mn(51)Cr(1), and more preferably approximately Pt(44)Mn(55.5)Cr(0.5). The thickness of pinning layer 64 in this case is preferably in the range of about 100 Å to about 300 Å, and more preferably approximately 200 Å. The composition of pinning layer 64 when PtMnPd is used is preferably in the range of about Pt(15)Mn(50)Pd(35) to about Pt(25)Mn(50)Pd(25), and more preferably approximately Pt(20)Mn(50)Pd(30). The thickness of pinning layer 64 in this case is preferably in the range of about 150 Å to about 300 Å, and more preferably approximately 250 Å.

The composition of pinned layer 66 is preferably approximately Co(90)Fe(10). The thickness of pinned layer 66 is preferably in the range of about 18 Å to about 30 Å, and more preferably approximately 25 Å.

The thickness of spacer layer 68 is preferably in the range of about 20 Å to about 35 Å, and more preferably approximately 29 Å.

The composition of first ferromagnetic layer 76 of free layer 70 is preferably approximately Co(90)Fe(10). The thickness of first ferromagnetic layer 76 of free layer 70 is preferably in the range of about 5 Å to about 25 Å, and more preferably approximately 13 Å. The composition of second ferromagnetic layer 78 of free layer 70 is preferably in the range of about Ni(85)Fe(15) to about Ni(80.5)Fe(19.5), and more preferably approximately Ni(82)Fe(18). The thickness of second ferromagnetic layer 78 of free layer 70 is preferably in the range of about 20 Å to about 100 Å, and more preferably approximately 30 Å.

Figure 4:
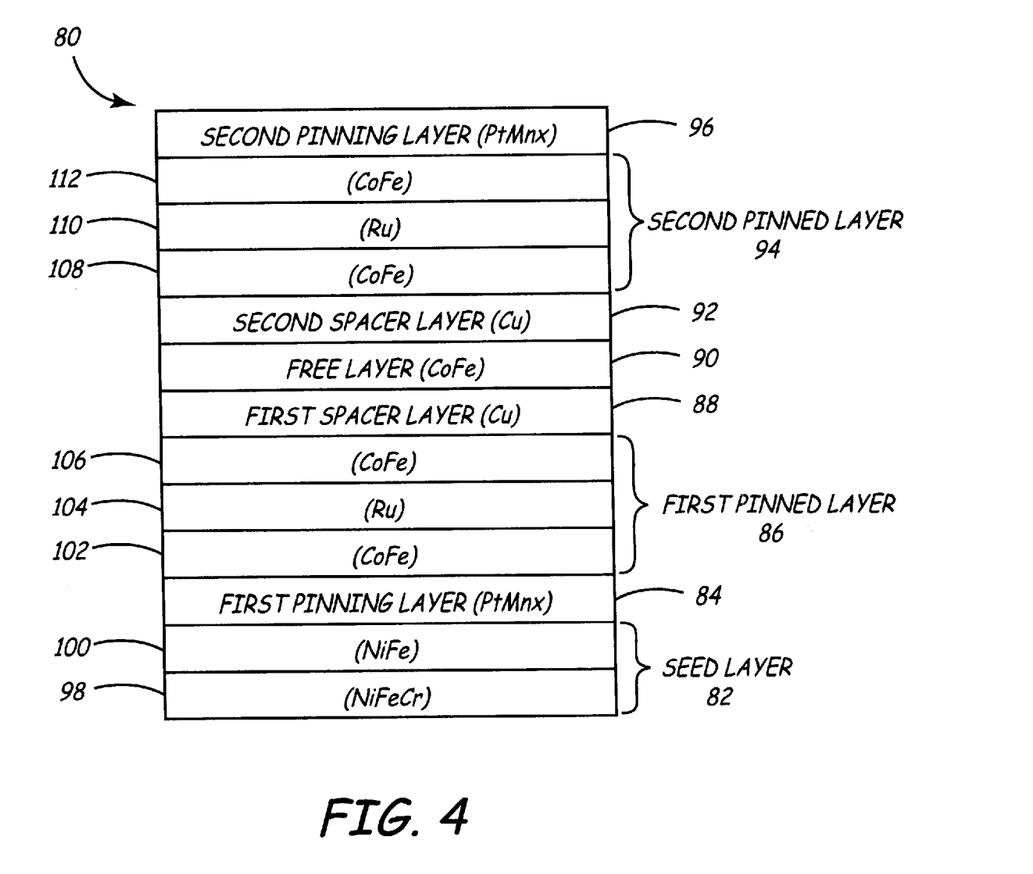
FIG. 4 is a layer diagram of a fourth embodiment of a giant magnetoresistive stack of the present invention.

FIG. 4 is a layer diagram of a fourth embodiment of a GMR stack 80 of the present invention, where GMR stack 80 is configured as a dual spin valve. GMR stack 80 includes a seed layer 82, a first pinning layer 84, a first pinned layer 86, a first spacer layer 88, a free layer 90, a second spacer layer 92, a second pinned layer 94, and a second pinning layer 96.

Seed layer 82 includes a NiFeCr layer 98 and a NiFe layer 100. First pinning layer 84 is PtMnX, where X is selected from the group consisting of Cr, Pd, Nb, Re, Rh, Ta, Ru, Os, Zr, Hf, Ni, Co, and Fe, and is positioned adjacent to ferromagnetic layer 100 of seed layer 82. First pinned layer 86 is a synthetic antiferromagnet and includes first and second ferromagnetic layers 102 and 106, both preferably CoFe, and a coupling layer 104, preferably ruthenium, positioned between first and second ferromagnetic layers 102 and 106, and is positioned such that first ferromagnetic layer 102 is adjacent to first pinning layer 84. Free layer 90 is a ferromagnetic material, preferably CoFe. First spacer layer 88 is a nonmagnetic material, preferably copper, and is positioned between free layer 90 and first pinned layer 86. Second pinned layer 94 is a synthetic antiferromagnet and includes first and second ferromagnetic layers 108 and 112, both preferably CoFe, and a coupling layer 110, preferably ruthenium, positioned between first and second ferromagnetic layers 108 and 112, and is positioned such that second ferromagnetic layer 112 is adjacent to second pinning layer 96. Second pinning layer 96 is PtMnX, where X is selected from the group consisting of Cr, Pd, Nb, Re, Rh, Ta, Ru, Os, Zr, Hf, Ni, Co, and Fe. Second spacer layer 92 is a nonmagnetic material, preferably copper, and is positioned between free layer 90 and second pinned layer 94.

The magnetization of each of first and second pinned layers 86 and 94 are fixed in predetermined directions, preferably parallel to each other, while the magnetization of free layer 90 rotates freely in response to an external magnetic field emanating from a magnetic medium. The magnetization of first pinned layer 86 is pinned by exchange coupling first pinning layer 84 with first pinned layer 86. The magnetization of second pinned layer 94 is pinned by exchange coupling second pinning layer 96 with second pinned layer 94. Each of first and second pinning layers 84 and 96 preferably have blocking temperatures of about 380° C. and annealing temperatures of about 270° C. The atomic structure of seed layer 82 is preferably face-centered cubic (fcc) to promote the [111] crystallographic texture and enhance the grain growth of pinning layer 84. The resistance of GMR stack 80 varies as a function of the angles that are formed between the magnetization of free layer 90 and the magnetizations of first and second pinned layers 86 and 94.

The composition of NiFeCr layer 98 of seed layer 82 is preferably in the range of about Ni(60)Fe(15)Cr(25) to about Ni(48)Fe(12)Cr(40), and more preferably approximately Ni(48)Fe(12)Cr(40), where the numbers in parentheses represent atomic percentage. The thickness of NiFeCr layer 98 of seed layer 82 is preferably in the range of about 20 Å to about 60 Å, and more preferably in the range of about 45 Å to about 50 Å. The composition of ferromagnetic layer 100 of seed layer 82 is preferably in the range of about Ni(85) Fe(15) to about Ni(80.5)Fe(19.5), and more preferably approximately Ni(82)Fe(18). The thickness of ferromagnetic layer 100 of seed layer 82 is preferably in the range of about 5 Å to about 30 Å, and more preferably approximately 10 Å.

The composition of first pinning layer 84 when PtMnCr is used is preferably in the range of about Pt(36)Mn(64)Cr(>0) to about Pt(48)Mn(51)Cr(1), and more preferably approximately Pt(44)Mn(55.5)Cr(0.5). The thickness of first pinning layer 84 in this case is preferably in the range of about 80 Å to about 150 Å, and more preferably approximately 100 Å. The composition of first pinning layer 84 when PtMnPd is used is preferably in the range of about Pt(15) Mn(50)Pd(35) to about Pt(25)Mn(50)Pd(25), and more preferably approximately Pt(20)Mn(50)Pd(30). The thickness of first pinning layer 84 in this case is preferably in the range of about 80 Å to about 150 Å, and more preferably approximately 100 Å.

The compositions of first and second ferromagnetic layers 102 and 106 of first pinned layer 86 are both preferably approximately Co(90)Fe(10). The thicknesses of first and second ferromagnetic layers 102 and 106 of first pinned layer 86 are both preferably in the range of about 15 Å to about 40 Å, and more preferably approximately 20 Å. The thickness of coupling layer 104 of first pinned layer 86 is preferably in the range of about 8 Å to about 12 Å.

The thickness of first spacer layer 88 is preferably in the range of about 20 Å to about 35 Å, and more preferably approximately 29 Å.

The composition of free layer 90 is preferably approximately Co(90)Fe(10). The thickness of free layer 90 is preferably in the range of about 20 Å to about 60 Å, and more preferably approximately 30 Å.

The thickness of second spacer layer 92 is preferably in the range of about 20 Å to about 35 Å, and more preferably approximately 29 Å.

The compositions of first and second ferromagnetic layers 108 and 112 of second pinned layer 94 are both preferably approximately Co(90)Fe(10). The thicknesses of first and second ferromagnetic layers 108 and 112 of second pinned layer 94 are both preferably in the range of about 15 Å to about 40 Å, and more preferably approximately 20 Å. The thickness of coupling layer 110 of second pinned layer 94 is preferably in the range of about 8 Å to about 12 Å.

The composition of second pinning layer 96 when PtMnCr is used is preferably in the range of about Pt(36) Mn(64)Cr(>0) to about Pt(48) Mn(51)Cr(1), and more preferably approximately Pt(44)Mn(55.5)Cr(0.5). The thickness of second pinning layer 96 in this case is preferably in the range of about 80 Å to about 150 Å, and more preferably approximately 100 Å. The composition of second pinning layer 96 when PtMnPd is used is preferably in the range of about Pt(15)Mn(50)Pd(35) to about Pt(25)Mn(50)Pd(25), and more preferably approximately Pt(20)Mn(50)Pd(30). The thickness of second pinning layer 96 in this case is preferably in the range of about 80 Å to about 150 Å, and more preferably approximately 100 Å.

Figure 5:
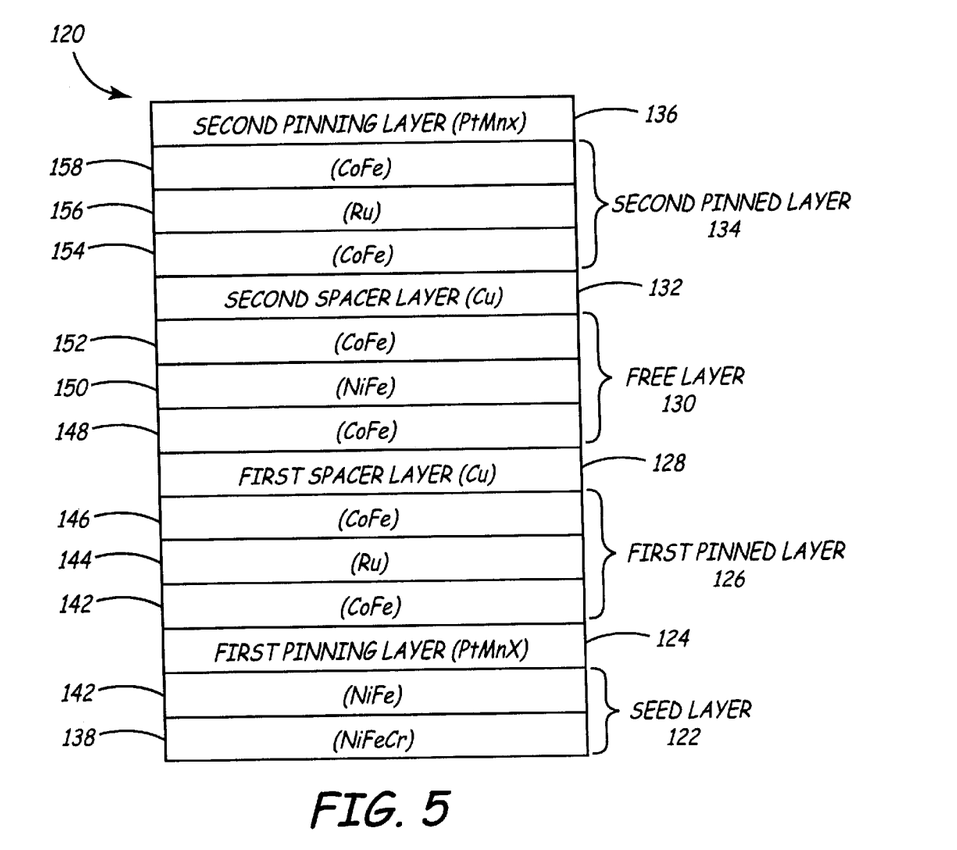
FIG. 5 is a layer diagram of a fifth embodiment of a giant magnetoresistive stack of the present invention.

FIG. 5 is a layer diagram of a fifth embodiment of a GMR stack 120 of the present invention, where GMR stack 120 is configured as a dual spin valve. GMR stack 120 includes a seed layer 122, a first pinning layer 124, a first pinned layer 126, a first spacer layer 128, a free layer 130, a second spacer layer 132, a second pinned layer 134, and a second pinning layer 136. GMR stack 120 is similar to GMR stack 80 of FIG. 4, except that free layer 130 of GMR stack 120 is a trilayer, while free layer 90 of GMR stack 80 is a single ferromagnetic layer.

Seed layer 122 includes a NiFeCr layer 138 and ferromagnetic layer 140, preferably NiFe. First pinning layer 124 is PtMnX, where X is selected from the group consisting of Cr, Pd, Nb, Re, Rh, Ta, Ru, Os, Zr, Hf, Ni, Co, and Fe, and is positioned adjacent to ferromagnetic layer 140 of seed layer 122. First pinned layer 126 is a synthetic antiferromagnet and includes first and second ferromagnetic layers 142 and 146, both preferably CoFe, and a coupling layer 144, preferably ruthenium, positioned between first and second ferromagnetic layers 142 and 146, and is positioned such that first ferromagnetic layer 142 is adjacent to first pinning layer 124. Free layer 130 includes first and second ferromagnetic layers 148 and 152, both preferably CoFe, and a third ferromagnetic layer 150, preferably NiFe, positioned between first and second ferromagnetic layers 148 and 152. First spacer layer 128 is a nonmagnetic material, preferably copper, and is positioned between free layer 130 and first pinned layer 126. Second pinned layer 134 is a synthetic antiferromagnet and includes first and second ferromagnetic layers 154 and 158, both preferably CoFe, and a coupling layer 156, preferably ruthenium, positioned between first and second ferromagnetic layers 154 and 158, and is positioned such that second ferromagnetic layer 158 is adjacent to second pinning layer 136. Second pinning layer 136 is PtMnX, where X is selected from the group consisting of Cr, Pd, Nb, Re, Rh, Ta, Ru, Os, Zr, Hf, Ni, Co, and Fe. Second spacer layer 132 is a nonmagnetic material, preferably copper, and is positioned between free layer 130 and second pinned layer 134.

The magnetization of each of first and second pinned layers 126 and 134 are fixed in predetermined directions, preferably parallel to each other, while the magnetization of free layer 130 rotates freely in response to an external magnetic field emanating from a magnetic medium. The magnetization of first pinned layer 126 is pinned by exchange coupling first pinning layer 124 with first pinned layer 126. The magnetization of second pinned layer 134 is pinned by exchange coupling second pinning layer 136 with second pinned layer 134. Each of first and second pinning layers 124 and 136 preferably have blocking temperatures of about 380° C. and annealing temperatures of about 270° C. The atomic structure of seed layer 122 is preferably face-centered cubic (fcc) to promote the [111] crystallographic texture and enhance the grain growth of pinning layer 124. The resistance of GMR stack 120 varies as a function of the angles that are formed between the magnetization of free layer 130 and the magnetizations of first and second pinned layers 126 and 134.

The composition of NiFeCr layer 138 of seed layer 122 is preferably in the range of about Ni(60)Fe(15)Cr(25) to about Ni(48)Fe(12)Cr(40), and more preferably approximately Ni(48)Fe(12)Cr(40), where the numbers in parentheses represent atomic percentage. The thickness of NiFeCr layer 138 of seed layer 122 is preferably in the range of about 20 Å to about 60 Å, and more preferably in the range of about 45 Å to about 50 Å. The composition of ferromagnetic layer 140 of seed layer 122 is preferably in the range of about Ni(85)Fe(15) to about Ni(80.5)Fe(19.5), and more preferably approximately Ni(82)Fe(18). The thickness of ferromagnetic layer 140 of seed layer 122 is preferably in the range of about 5 Å to about 30 Å, and more preferably approximately 10 Å.

The composition of first pinning layer 124 when PtMnCr is used is preferably in the range of about Pt(36)Mn(64)Cr (>0) to about Pt(48)Mn(51)Cr(1), and more preferably approximately Pt(44)Mn(55.5)Cr(0.5). The thickness of first pinning layer 124 in this case is preferably in the range of about 80 Å to about 150 Å, and more preferably approximately 100 Å. The composition of first pinning layer 124 when PtMnPd is used is preferably in the range of about Pt(15)Mn(50)Pd(35) to about Pt(25)Mn(50)Pd(25), and more preferably approximately Pt(20)Mn(50)Pd(30). The thickness of first pinning layer 124 in this case is preferably in the range of about 80 Å to about 150 Å, and more preferably approximately 100 Å.

The compositions of first and second ferromagnetic layers 142 and 146 of first pinned layer 126 are both preferably approximately Co(90)Fe(10). The thicknesses of first and second ferromagnetic layers 142 and 146 of first pinned layer 126 are both preferably in the range of about 15 Å to about 40 Å, and more preferably approximately 20 Å. The thickness of coupling layer 144 of first pinned layer 126 is preferably in the range of about 8 Å to about 12 Å.

The thickness of first spacer layer 128 is preferably in the range of about 20 Å to about 35 Å, and more preferably approximately 29 Å.

The compositions of first and second ferromagnetic layers 148 and 152 of free layer 130 are both preferably approximately Co(90)Fe(10). The thicknesses of first and second ferromagnetic layers 148 and 152 of free layer 130 are both preferably in the range of about 13 Å to about 20 Å. The composition of third ferromagnetic layer 150 of free layer 130 is preferably in the range of about Ni(85)Fe(15) to about Ni(80.5)Fe(19.5), and more preferably approximately Ni(82)Fe(18). The thickness of third ferromagnetic layer 150 of free layer 130 is preferably in the range of about 10 Å to about 40 Å.

The thickness of second spacer layer 132 is preferably in the range of about 20 Å to about 35 Å, and more preferably approximately 29 Å.

The compositions of first and second ferromagnetic layers 154 and 158 of second pinned layer 134 are both preferably approximately Co(90)Fe(10). The thicknesses of first and second ferromagnetic layers 154 and 158 of second pinned layer 134 are both preferably in the range of about 15 Å to about 40 Å, and more preferably approximately 20 Å. The thickness of coupling layer 156 of second pinned layer 134 is preferably in the range of about 8 Å to about 12 Å.

The composition of second pinning layer 136 when PtMnCr is used is preferably in the range of about Pt(36) Mn(64)Cr(>0) to about Pt(48)Mn(51)Cr(1), and more preferably approximately Pt(44)Mn(55.5)Cr(0.5). The thickness of second pinning layer 136 in this case is preferably in the range of about 80 Å to about 150 Å, and more preferably approximately 100 Å. The composition of second pinning layer 136 when PtMnPd is used is preferably in the range of about Pt(15)Mn(50)Pd(35) to about Pt(25)Mn(50)Pd(25), and more preferably approximately Pt(20)Mn(50)Pd(30). The thickness of second pinning layer 136 in this case is preferably in the range of about 80 Å to about 150 Å, and more preferably approximately 100 Å.

Figure 6:
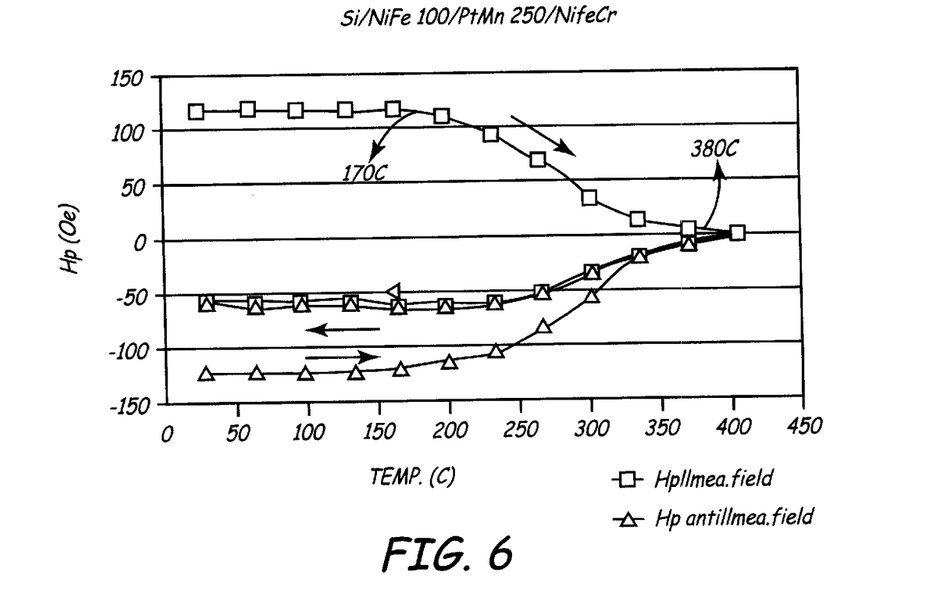
FIG. 6 is a graph of the blocking temperature measurement of a PtnX pinning layer.

FIG. 6 is a graph of the exchange coupling field (Oe) of a PtMn pinned GMR stack as a function of temperature (°

C.). The blocking temperature of the PtMn pinning layer is the temperature at which the exchange coupling field becomes 0 Oe. Accordingly, the graph shows a blocking temperature of 380° C.

Figure 7:
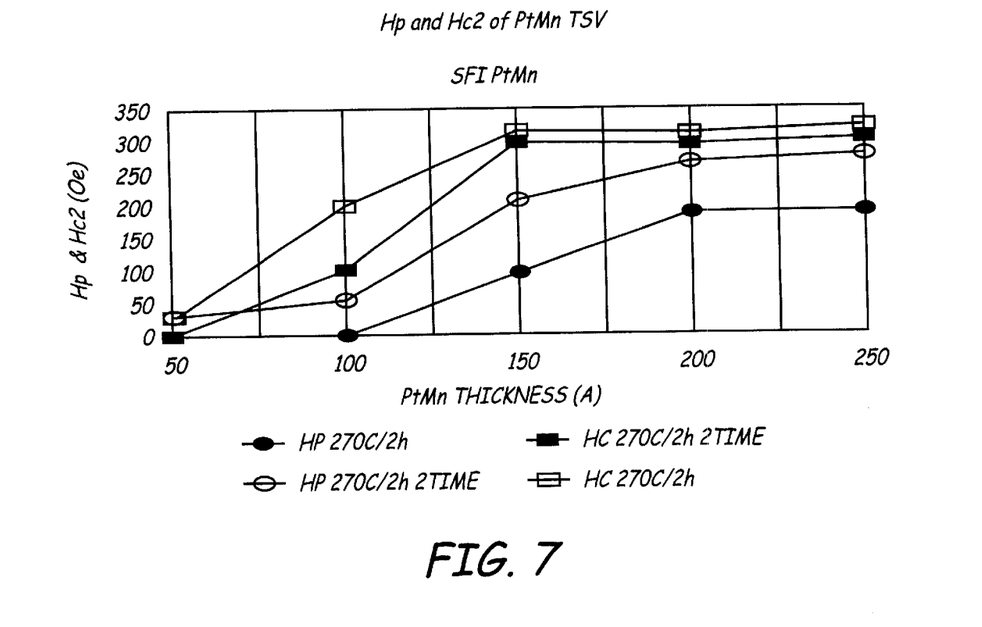
FIG. 7 is a graph of the pinning strength measurement of the first embodiment of a giant magnetoresistive stack of the present invention.

FIG. 7 is a graph of the exchange coupling field (Oe) of GMR stack 10 of the present invention as a function of the thickness of the pinning layer (Å) at a temperature of 270° C. The graph illustrates that an annealing temperature of 270° C. is sufficient to pin pinned layer 18.

Figure 8:
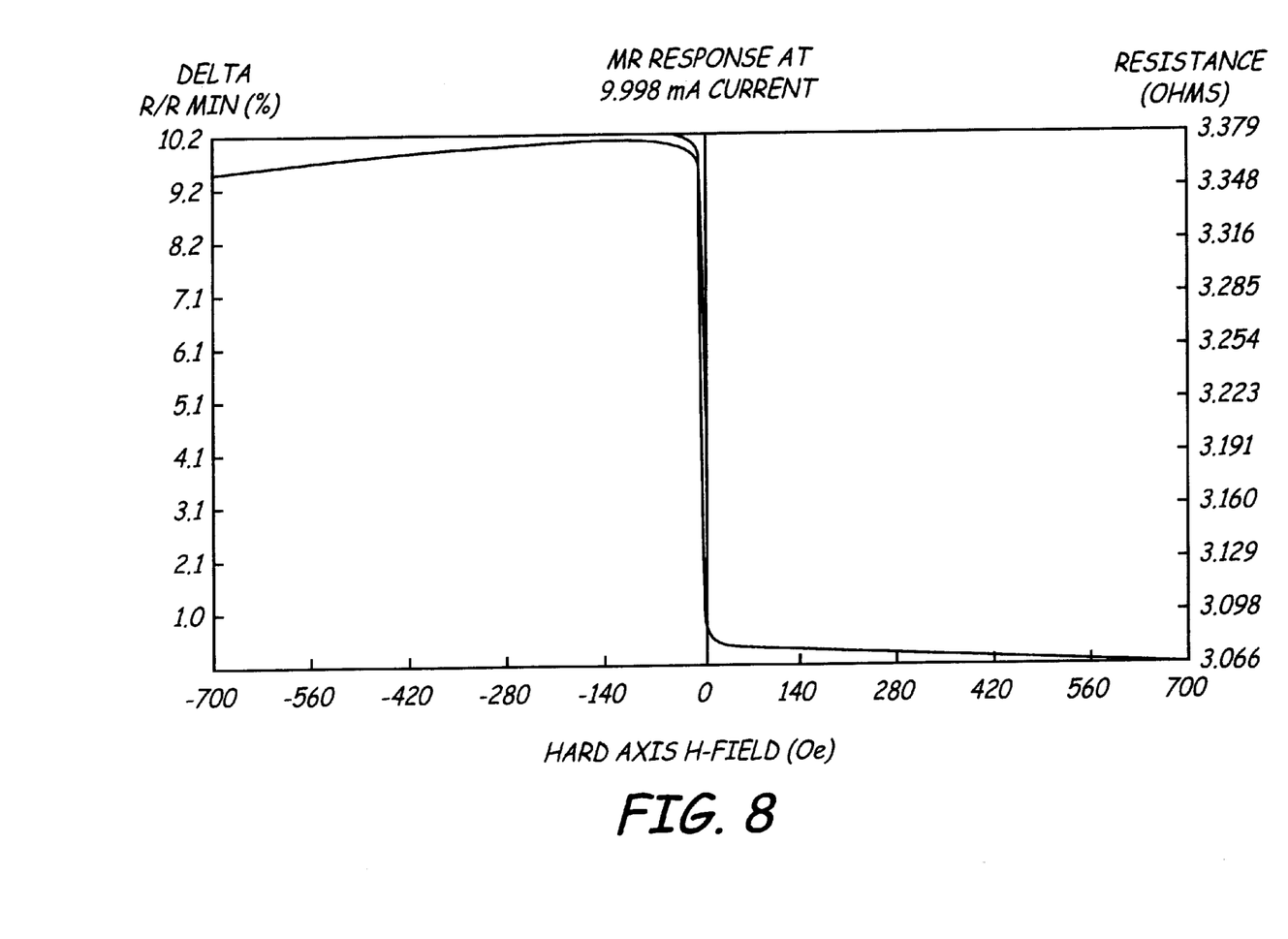
FIG. 8 is a graph of the GMR response of the second embodiment of a giant magnetoresistive stack of the present invention.

FIG. 8 is a graph of the GMR response of GMR stack 30 of the present invention. The graph shows the GMR ratio (the maximum absolute change in resistance of the GMR read sensor divided by the resistance of the GMR read sensor multiplied by 100%) of stack 30 as a function of an applied magnetic field (Oe). The GMR ratio of GMR stack 30 is about 10.3%.

Figure 9:
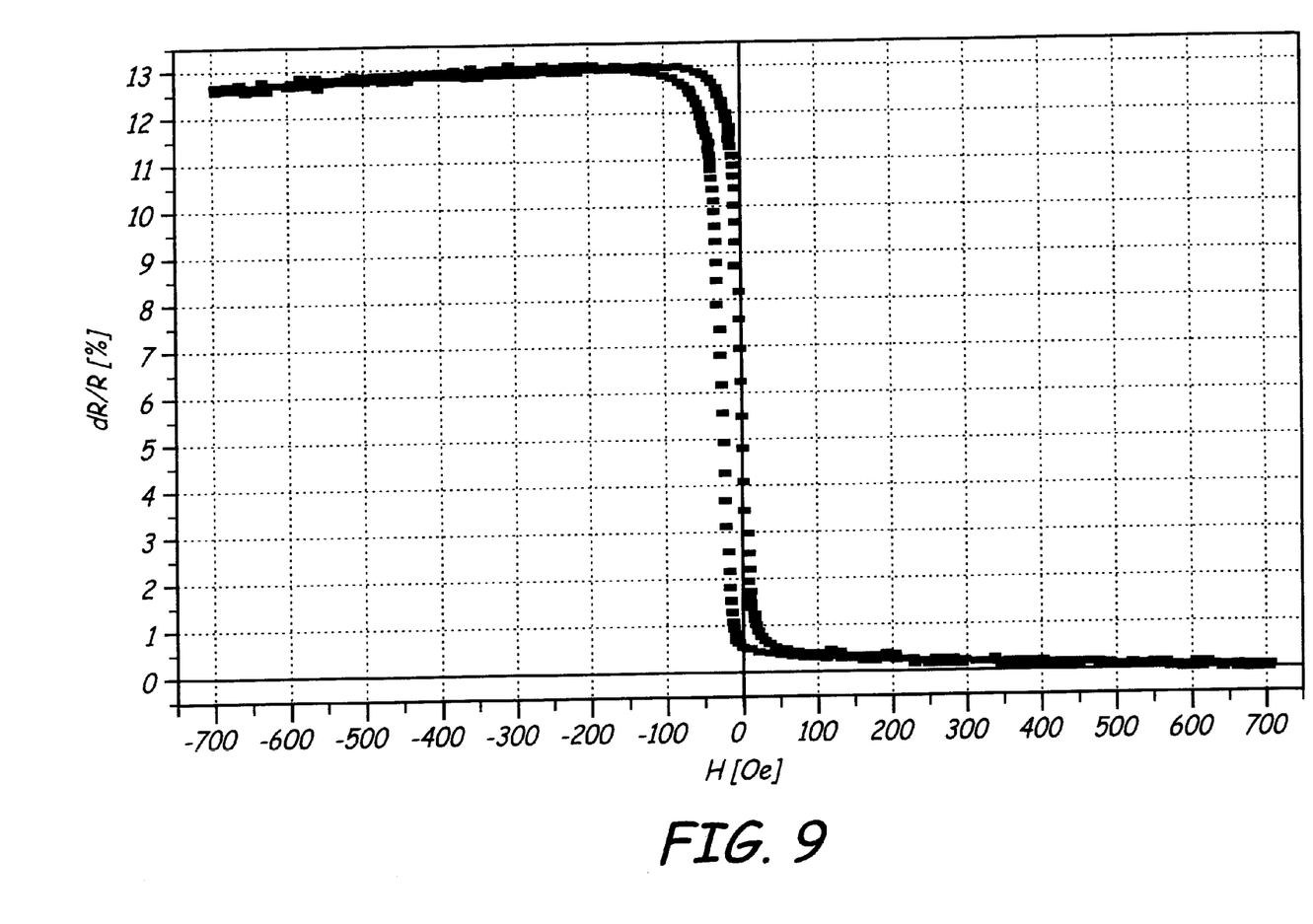
FIG. 9 is a graph of the GMR response of the third embodiment of a giant magnetoresistive stack of the present invention.

FIG. 9 is a graph of the GMR response of GMR stack 60 of the present invention. The graph shows the GMR ratio of stack 60 as a function of an applied magnetic field (Oe). The GMR ratio of GMR stack 60 is about 13.0%.

Figure 10:
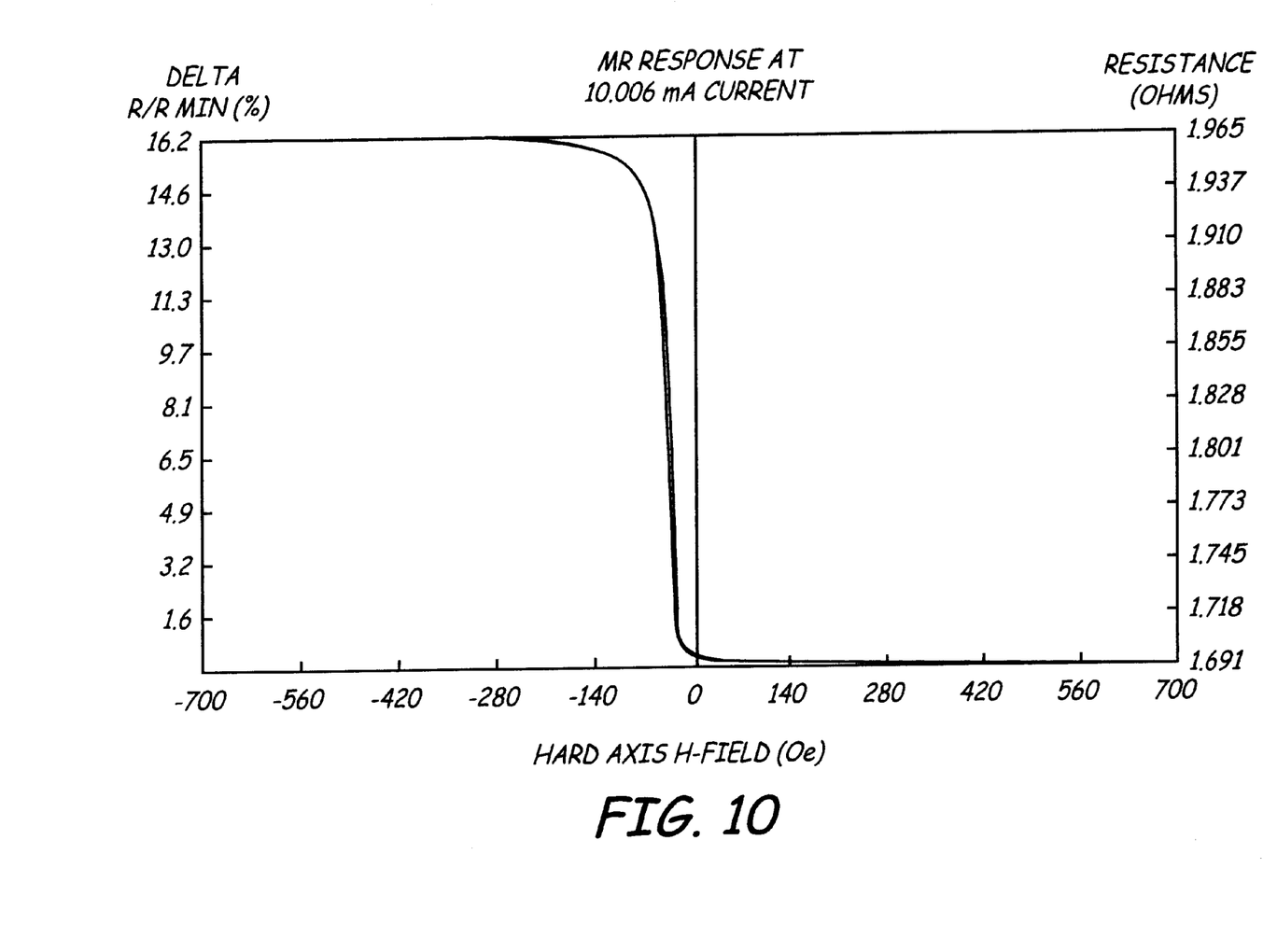
FIG. 10 is a graph of the GMR response of the fifth embodiment of a giant magnetoresistive stack of the present invention.

FIG. 10 is a graph of the GMR response of GMR stack 120 of the present invention. The graph shows the GMR ratio of stack 120 as a function of an applied magnetic field (Oe). The GMR ratio of GMR stack 120 is about 16.2%.

In summary, the present invention introduces a GMR read sensor with a NiFeCr seed layer and a PtMnX pinning layer, where X is selected from the group consisting of Cr, Pd, Nb, Re, Rh, Ta, Ru, Os, Zr, Hf, Ni, Co, and Fe. The pinning layer has a high blocking temperature of about 380° C. to prevent the exchange coupling from disappearing. Also, the pinning layer has a low annealing temperature of about 270° C. to control magnetic behavior and prevent diffusion between thin layers in the GMR read sensor during manufacturing. In addition, the seed layer/pinning layer combination produces a high pinning strength. The resulting GMR read sensor can produce a high GMR ratio of about 16.2%.

Although the present invention has been described with reference to preferred embodiments, workers skilled in the art will recognize that changes may be made in form and detail without departing from the spirit and scope of the invention.

What is claimed is:

1. A read sensor for use in a magnetic read head, the read sensor comprising:
   a giant magnetoresistive stack having a ferromagnetic pinned layer and a seed layer; and
   means for providing a high pinning strength exchange coupling field to pin the pinned layer while having a high blocking temperature and a low annealing temperature, wherein the means includes a NiFeCr seed layer and a PtMnX pinning layer, where the X in the PtMnX pinning layer is selected from the group consisting of Cr, Pd, Nb, Re, Rh, Ta, Ru, Os, Zr, Hf, Ni, Co, and Fe, and wherein the atomic percentage of nickel in the NiFeCr seed layer is about 48, the atomic percentage of iron in the NiFeCr seed layer is about 12 and the atomic percentage of chromium in the NiFeCr seed layer is about 40.

2. A read sensor for use in a magnetic read head, the read sensor comprising:
   a giant magnetoresistive stack having a ferromagnetic pinned layer and a seed layer; and
   means for providing a high pinning strength exchange coupling field to pin the pinned layer while having a high blocking temperature and a low annealing temperature, wherein the means includes a NiFeCr seed layer and a PtMnCr pinning layer, and wherein the atomic percentage of platinum in the PtMnCr pinning layer is in the range of about 36 to about 48, the atomic percentage of manganese in the PtMnCr pinning layer is in the range of about 51 to about 64 and the atomic percentage of chromium in the PtMnCr pinning layer is in the range of greater than 0 to about 1.

3. The read sensor of claim 2 wherein the atomic percentage of platinum in the PtMnCr pinning layer is about 44, the atomic percentage of manganese in the PtMnCr pinning layer is about 55.5 and the atomic percentage of chromium in the PtMnCr pinning layer is about 0.5.

4. A read sensor for use in a magnetic read head, the read sensor comprising:
   a giant magnetoresistive stack having a ferromagnetic pinned layer and a seed layer; and
   means for providing a high pinning strength exchange coupling field to pin the pinned layer while having a high blocking temperature and a low annealing temperature, wherein the means includes a NiFeCr seed layer and a PtMnPd pinning layer, and wherein the atomic percentage of platinum in the PtMnPd pinning layer is in the range of about 15 to about 25, the atomic percentage of manganese in the PtMnPd pinning layer is about 50 and the atomic percentage of palladium in the PtMnPd pinning layer is in the range of about 25 to about 35.

5. The read sensor of claim 4 wherein the atomic percentage of platinum in the PtMnPd pinning layer is about 20, the atomic percentage of manganese in the PtMnPd pinning layer is about 50 and the atomic percentage of palladium in the PtMnPd pinning layer is about 30.

6. A giant magnetoresistive stack for use in a magnetic read head, the giant magnetoresistive stack comprising:
   a ferromagnetic free layer having a rotatable magnetic moment;
   a first ferromagnetic pinned layer having a fixed magnetic moment, wherein the first pinned layer is a synthetic antiferromagnet;
   a first nonmagnetic spacer layer positioned between the free layer and the first pinned layer;
   a first PtMnX pinning layer positioned adjacent the first pinned layer such that the first pinned layer is positioned between the first spacer layer and the first PtMnX pinning layer, wherein the X in the PtMnX pinning layer is selected from the group consisting of Cr, Pd, Nb, Re, Rh, Ta, Ru, Os, Zr, Hf, Ni, Co, and Fe; and
   a NiFeCr seed layer.

7. The giant magnetoresistive stack of claim 6 wherein the synthetic antiferromagnet comprises:
   a first CoFe layer;
   a second CoFe layer; and
   a ruthenium layer positioned between the first and second CoFe layers.

8. The giant magnetoresistive stack of claim 6 wherein the NiFeCr seed layer is positioned adjacent the free layer such that the free layer is positioned between the NiFeCr seed layer and the first spacer layer.

9. The giant magnetoresistive stack of claim 6 wherein the NiFeCr seed layer is positioned adjacent the first PtMnX pinning layer such that the first PtMnX pinning layer is positioned between the NiFeCr seed layer and the first pinned layer.

10. The giant magnetoresistive stack of claim 6 wherein the free layer is a bilayer comprising:
- a NiFe layer; and
- a CoFe layer positioned adjacent to the first spacer layer.

11. A giant magnetoresistive stack for use in a magnetic read head, the giant magnetoresistive stack comprising:
- a ferromagnetic free layer having a rotatable magnetic moment;
- a first ferromagnetic pinned layer having a fixed magnetic moment;
- a first nonmagnetic spacer layer positioned between the free layer and the first pinned layer;
- a first PtMnX pinning layer positioned adjacent the first pinned layer such that the first pinned layer is positioned between the first spacer layer and the first PtMnX pinning layer, wherein the X in the PtMnX pinning layer is selected from the group consisting of Cr, Pd, Nb, Re, Rh, Ta, Ru, Os, Zr, Hf, Ni, Co, and Fe;
- a NiFeCr seed layer positioned such that the first PtMnX pinning layer is positioned between the NiFeCr seed layer and the first pinned layer; and
- a NiFe seed layer positioned between the NiFeCr seed layer and the first PtMnX pinning layer.

12. A giant magnetoresistive stack for use in a magnetic read head, the giant magnetoresistive stack comprising:
- a ferromagnetic free layer having a rotatable magnetic moment;
- a first ferromagnetic pinned layer having a fixed magnetic moment;
- a first nonmagnetic spacer layer positioned between the free layer and the first pinned layer;
- a first PtMnX pinning layer positioned adjacent the first pinned layer such that the first pinned layer is positioned between the first spacer layer and the first PtMnX pinning layer, wherein the X in the PtMnX pinning layer is selected from the group consisting of Cr, Pd, Nb, Re, Rh, Ta, Ru, Os, Zr, Hf, Ni, Co, and Fe;
- a NiFeCr seed layer positioned adjacent the first PtMnX pinning layer such that the first PtMnX pinning layer is positioned between the NiFeCr seed layer and the first pinned layer;
- a second ferromagnetic pinned layer having a fixed magnetic moment;
- a second nonmagnetic spacer layer positioned between the free layer and the second pinned layer; and
- a second PtMnX pinning layer positioned adjacent the second pinned layer such that the second pinned layer is positioned between the second spacer layer and the second PtMnX pinning layer, wherein the X in the second PtMnX pinning layer is selected from the group consisting of Cr, Pd, Nb, Re, Rh, Ta, Ru, Os, Zr, Hf, Ni, Co, and Fe.

13. The giant magnetoresistive stack of claim 12 wherein the second pinned layer is a synthetic antiferromagnet.

14. The giant magnetoresistive stack of claim 13 wherein the synthetic antiferromagnet comprises:
- a first CoFe layer;
- a second CoFe layer; and
- a ruthenium layer positioned between the first and second CoFe layers.

15. The giant magnetoresistive stack of claim 12 wherein the free layer is a trilayer comprising:
- a first CoFe layer;
- a second CoFe layer; and
- a NiFe layer positioned between the first and second CoFe layers.

16. A giant magnetoresistive stack for use in a magnetic read head, the giant magnetoresistive stack comprising:
- a ferromagnetic free layer having a rotatable magnetic moment;
- a first ferromagnetic pinned layer having a fixed magnetic moment;
- a first nonmagnetic spacer layer positioned between the free layer and the first pinned layer;
- a first PtnX pinning layer positioned adjacent the first pinned layer such that the first pinned layer is positioned between the first spacer layer and the first PtMnX pinning layer, wherein the X in the PtMnX pinning layer is selected from the group consisting of Cr, Pd, Nb, Re, Rh, Ta, Ru, Os, Zr, Hf, Ni, Co, and Fe; and
- a NiFeCr seed layer, wherein the atomic percentage of nickel in the NiFeCr seed layer is in the range of about 48 to about 60, the atomic percentage of iron in the NiFeCr seed layer is in the range of about 12 to about 15 and the atomic percentage of chromium in the NiFeCr seed layer is about 40.

17. The giant magnetoresistive stack of claim 16 wherein the atomic percentage of nickel in the NiFeCr seed layer is about 48, the atomic percentage of iron in the NiFeCr seed layer is about 12 and the atomic percentage of chromium in the NiFeCr seed layer is about 40.

18. A giant magnetoresistive stack for use in a magnetic read head, the giant magnetoresistive stack comprising:
- a ferromagnetic free layer having a rotatable magnetic moment;
- a first ferromagnetic pinned layer having a fixed magnetic moment;
- a first nonmagnetic spacer layer positioned between the free layer and the first pinned layer;
- a PtMnCr pinning layer positioned adjacent the first pinned layer such that the first pinned layer is positioned between the first spacer layer and the PtMnCr pinning layer, wherein the atomic percentage of platinum in the PtMnCr pinning layer is in the range of about 36 to about 48, the atomic percentage of manganese in the PtMnCr pinning layer is in the range of about 51 to about 64 and the atomic percentage of chromium in the PtMnCr pinning layer is in the range of greater than 0 to about 1; and
- a NiFeCr seed layer.

19. The giant magnetoresistive stack of claim 18 wherein the atomic percentage of platinum in the PtMnCr pinning layer is about 44, the atomic percentage of manganese in the PtMnCr pinning layer is about 55.5 and the atomic percentage of chromium in the PtMnCr pinning layer is about 0.5.

20. A giant magnetoresistive stack for use in a magnetic read head, the giant magnetoresistive stack comprising:
- a ferromagnetic free layer having a rotatable magnetic moment;
- a ferromagnetic pinned layer having a fixed magnetic moment;
- a nonmagnetic spacer layer positioned between the free layer and the pinned layer;
- a PtMnPd pinning layer positioned adjacent the pinned layer such that the pinned layer is positioned between the spacer layer and the PtMnPd pinning layer, wherein the atomic percentage of platinum in the PtMnPd pinning layer is in the range of about 15 to about 25, the atomic percentage of manganese in the PtMnPd pinning layer is about 50 and the atomic percentage of palladium in the PtMnPd pinning layer is in the range of about 25 to about 35; and a NiFeCr seed layer.

21. The giant magnetoresistive stack of claim 20 wherein the atomic percentage of platinum in the PtMnPd pinning layer is about 20, the atomic percentage of manganese in the PtMnPd pinning layer is about 50 and the atomic percentage of palladium in the PtMnPd pinning layer is about 30.

* * * * *